(12) United States Patent
Cheng et al.

(10) Patent No.: US 9,865,705 B2
(45) Date of Patent: Jan. 9, 2018

(54) VERTICAL FIELD EFFECT TRANSISTORS WITH BOTTOM SOURCE/DRAIN EPITAXY

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/171,040

(22) Filed: Jun. 2, 2016

(65) Prior Publication Data

US 2017/0352742 A1    Dec. 7, 2017

(51) Int. Cl.

| | |
|---|---|
| *H01L 29/66* | (2006.01) |
| *H01L 29/78* | (2006.01) |
| *H01L 21/02* | (2006.01) |
| *H01L 29/06* | (2006.01) |
| *H01L 29/08* | (2006.01) |
| *H01L 29/423* | (2006.01) |

(Continued)

(52) U.S. Cl.
CPC .. *H01L 29/66666* (2013.01); *H01L 21/02609* (2013.01); *H01L 21/3065* (2013.01); *H01L 29/0653* (2013.01); *H01L 29/0657* (2013.01); *H01L 29/0847* (2013.01); *H01L 29/41741* (2013.01); *H01L 29/4238* (2013.01); *H01L 29/7827* (2013.01); *H01L 29/42392* (2013.01)

(58) Field of Classification Search
CPC ........... H01L 29/66666; H01L 29/7827; H01L 29/0657; H01L 29/0847; H01L 29/41741; H01L 21/3065; H01L 21/02609; H01L 29/0653; H01L 29/4238; H01L 29/42392
USPC ........................................................ 257/331
See application file for complete search history.

(56) References Cited

U.S. PATENT DOCUMENTS

| | | |
|---|---|---|
| 7,230,286 B2 | 6/2007 | Cohen et al. |
| 7,586,149 B2 | 9/2009 | Yoon et al. |

(Continued)

FOREIGN PATENT DOCUMENTS

| | | |
|---|---|---|
| EP | 1711966 | 2/2012 |
| KR | 1020070038233 | 4/2007 |

(Continued)

*Primary Examiner* — Caleen Sullivan
(74) *Attorney, Agent, or Firm* — Fleit Gibbons Gutman Bongini & Bianco PL; Thomas S. Grzesik

(57) ABSTRACT

A vertical fin field-effect-transistor and a method for fabricating the same. The vertical fin field-effect-transistor includes a substrate, a first source/drain layer including a plurality of pillar structures, and a plurality of fins disposed on and in contact with the plurality of pillar structures. A doped layer epitaxially grown from the first source/drain layer is in contact with the plurality of fins and the plurality of pillar structures. A gate structure is disposed in contact with two or more fins in the plurality of fins. The gate structure includes a dielectric layer and a gate layer. A second source/drain layer is disposed on the gate structure. The method includes epitaxially growing a doped layer in contact with a plurality of fins and a plurality of pillar structures. A gate structure is formed in contact with two or more fins. A second source/drain layer is formed on the gate structure.

20 Claims, 12 Drawing Sheets

(51) Int. Cl.
*H01L 29/417* (2006.01)
*H01L 21/3065* (2006.01)
*H01L 21/30* (2006.01)

(56) References Cited

U.S. PATENT DOCUMENTS

| | | |
|---|---|---|
| 7,892,956 B2 | 2/2011 | Deligianni et al. |
| 8,207,032 B2 | 6/2012 | Fischer et al. |
| 8,409,948 B2 | 4/2013 | Fischer et al. |
| 2012/0052640 A1* | 3/2012 | Fischer ........... H01L 21/823425 438/268 |
| 2013/0193400 A1 | 8/2013 | Sandhu et al. |

FOREIGN PATENT DOCUMENTS

| | | |
|---|---|---|
| TW | 233377 | 11/1994 |
| WO | 2013112253 | 8/2013 |

\* cited by examiner

VERTICAL FIELD EFFECT TRANSISTORS WITH BOTTOM SOURCE/DRAIN EPITAXY

BACKGROUND OF THE INVENTION

The present invention generally relates to the field of semiconductors, and more particularly relates to vertical field-effect-transistors (FETs) having bottom source/drain epitaxy.

Vertical transistors are a promising option for technology scaling for 5 nm and beyond. However, during fabrication of these transistors it is difficult to form an aligned bottom junction since there is not guarantee that etching of the fins stops at the edge of the highly doped source/drain layer. Conventional fin etching processes usually result in the fins having a wider bottom portion where it is not suitable for forming FET channels.

SUMMARY OF THE INVENTION

In one embodiment, a method for fabricating a vertical fin field-effect-transistor is provided. The method includes forming a structure including a substrate, a first source/drain layer including a plurality of pillar structures, and a plurality of fins formed on and in contact with the plurality of pillar structures. A doped layer is epitaxially grown from the first source/drain layer in contact with the plurality of fins and the plurality of pillar structures. A gate structure is formed in contact with two or more fins in the plurality of fins. The gate structure includes a dielectric layer and a gate layer. A second source/drain layer is formed on the gate structure.

In another embodiment, a vertical fin field-effect-transistor is provided. The vertical field-effect-transistor includes a substrate and a first source/drain layer. The first source/drain layer includes a plurality of pillar structures. A plurality of fins is disposed on and in contact with a pillar structure in the plurality of pillar structures. A doped epitaxy layer grown from the first source/drain layer is disposed on and in contact with the plurality of fins and the plurality of pillar structures. A gate structure is in contact with the plurality of fins. A second source/drain layer is disposed on the gate structure.

In yet another embodiment, an integrated circuit is provided. The integrated circuit includes a vertical fin field-effect-transistor. The vertical field-effect-transistor includes a substrate and a first source/drain layer. The first source/drain layer includes a plurality of pillar structures. Each fin in a plurality of fins is disposed on and in contact with a pillar structure in the plurality of pillar structures. A doped epitaxy layer grown from the first source/drain layer is disposed on and in contact with the plurality of fins and the plurality of pillar structures. A gate structure is in contact with the plurality of fins. A second source/drain layer is disposed on the gate structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
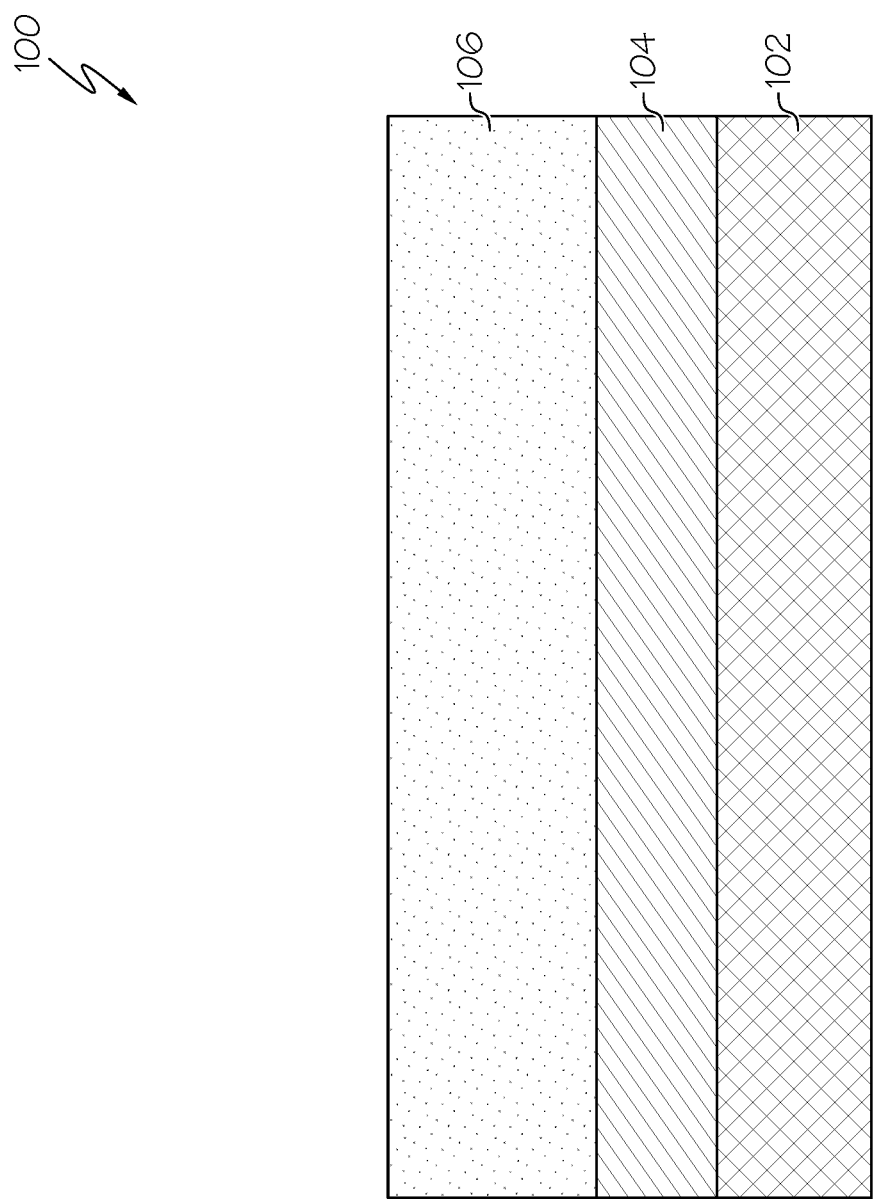
FIG. 1 is a cross-sectional view of an initial semiconductor structure according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-11 illustrate various processes for fabricating vertical field-effect-transistors (FETs) with bottom source/drain epitaxy. FIG. 1 shows a substrate a partial semiconductor structure/device 100 including a substrate 102, a bottom source/drain layer 104, and a channel layer 106. The substrate 102 can be single crystalline and or a bulk substrate, a semiconducto on-insulator (SOI) substrate, or a hybrid substrate. An optional insulator layer (not shown) including a dielectric material such as silicon oxide, silicon nitride, silicon oxynitride, or any combination thereof, in one embodiment, is formed on an in contact with the substrate 102. The thickness of the substrate 102 is, for example, from 50 microns to 1,000 microns, although lesser and greater thicknesses can be employed as well.

The substrate 102, in one embodiment, is appropriately doped either with p-type dopant atoms and/or with n-type dopant atoms, or the material can be substantially undoped (intrinsic). The dopant concentration of the substrate 102 can be from $1.0 \times 10^{15}/cm^3$ to $1.0 \times 10^{19}/cm^3$, and in one embodiment, is from $1.0 \times 10^{16} cm^3$ to $3.0 \times 10^{18}/cm^3$, although lesser and greater dopant concentrations are applicable as well. Optionally, a counter-doped layer (not shown) is formed on and in contact with the substrate 102 (or buried insulator layer if formed). The counter-doped layer, in one embodiment, is formed by an epitaxial growth of a semiconductor material. The counter-doped layer, in one embodiment, is implanted with dopants and annealed using, for example, rapid thermal anneal. Alternatively, the counter-doped layer can be doped in-situ during the epitaxial growth. The purpose of the counter-doped layer is to provide isolation between one transistor and the next transistor.

FIG. 1 further shows that, in one embodiment, a bottom source/drain layer 104 is formed on and in contact with the substrate 102 (or counter-doped layer if formed). The bottom source/drain layer 104 can be, for example, an n++ doped region or a p++ doped region of the substrate 102 and can have a thickness in a range of, for example, about 10 nm to about 200 nm. However, other thicknesses are applicable as well. The bottom source/drain region 104, in one embodiment, is formed by epitaxial growth. The channel layer 106 is formed on and in contact with the bottom source/drain layer 104. The channel layer 106 includes a channel material that can be undoped or doped with either p-type or n-type dopants through ion implantation, plasma doping, or gas phase doping. P-type doping is produced by doping the channel material with elements from group III of the periodic table (e.g., boron, aluminum, gallium, or indium). As an example, the dopant is boron in a concentration ranging from 1×10E17 atoms/cm3 to 1×10E22 atoms/cm3. N-type doping is produced by doping the channel material with elements from group V of the periodic table (e.g., phosphorus, antimony, or arsenic). As an example, the dopant is phosphorus in a concentration ranging from 1×10E14 atoms/cm3 to 1×10E20 atoms/cm3. The channel layer 106 is formed by epitaxial growth.

The terms "epitaxial growth", "epitaxial deposition", "epitaxially formed", epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in one or more embodiments 104 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources may be used for the deposition of the various layers discussed herein. For example, the gas source for the deposition of epitaxial semiconductor material may include a silicon containing gas source, a germanium containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium containing gas sources are germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

Figure 2:
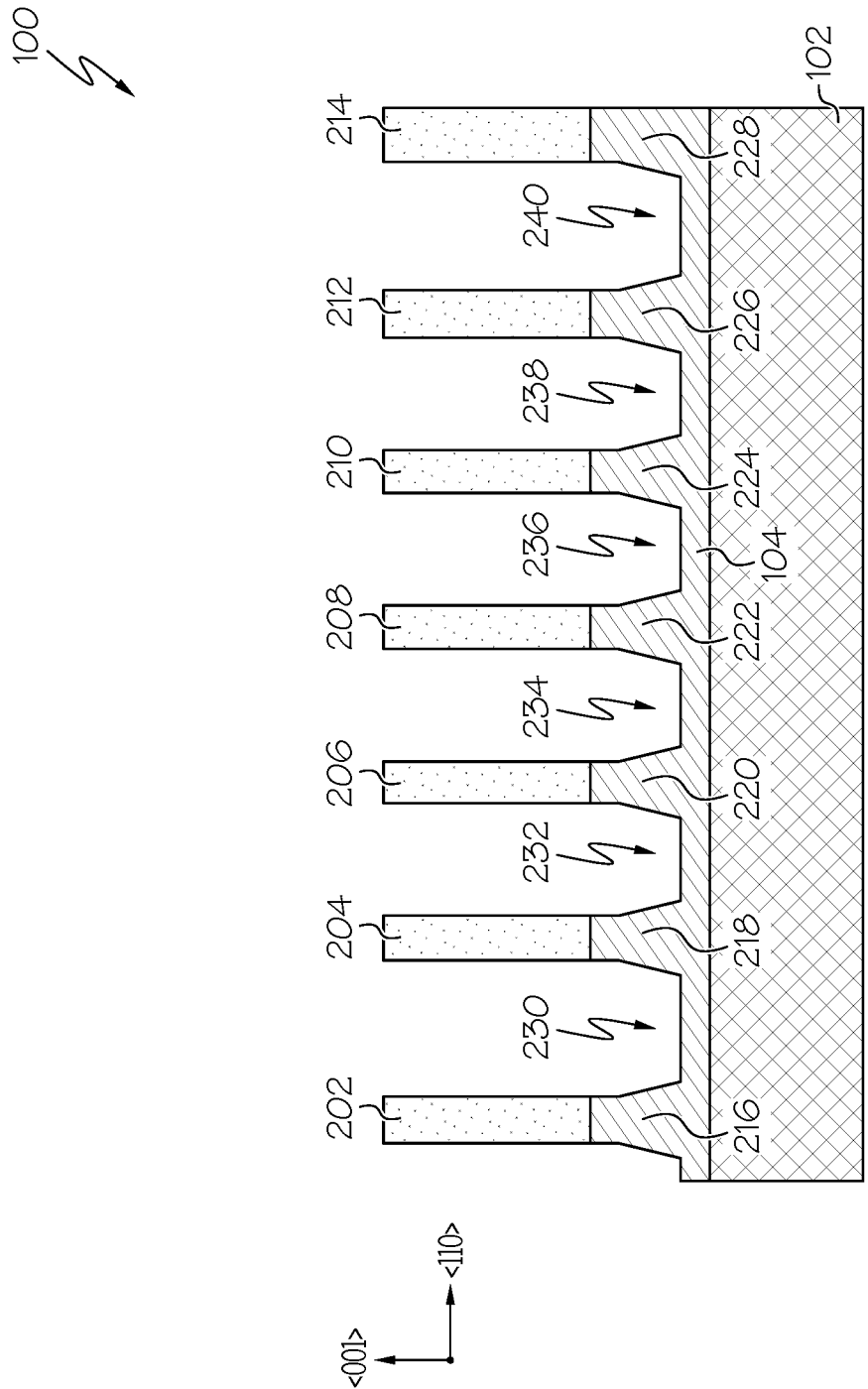
FIG. 2 is a cross-sectional view of the semiconductor structure after fin structures have been formed according to one embodiment of the present invention.

FIG. 2 shows the semiconductor device 100 after fin structures 202 to 214, have been formed in the channel layer 106. The fins 202 to 214 are formed, in one embodiment, by forming an etch-stop capping layer onto the channel material through, for example, deposition. The etch-stop capping layer, in one embodiment, may be made of silicon-nitride although other material suitable in providing etch-stop function may be used as well. One or more fin structures 202 to 214, are subsequently formed or etched out of the channel material to be on top of and in contact with the bottom source/drain layer 104 through a process involving masking, using industry-standard lithographic techniques, and directionally etching the etch-stop capping layer and underneath channel material.

The directional etching process, for example a reactive-ion-etching (RIE) process, stops within the bottom source/drain layer 104 (e.g., below a top surface of the bottom source/drain layer 104 and above a bottom surface of the bottom source/drain layer 104). The etching results in pillar structures 216 to 228 being formed from the bottom source/drain layer 104, where a pillar structure is under and in contact with a bottom surface of each fin structure 202 to 214. In one embodiment, a bottom portion of each pillar structure is wider than a top portion of each pillar structure and the fin structure itself. The etching also results in a well/cavity 230 to 240 being formed between each pillar structure 216 to 228 and below the fin structures. In one embodiment, the fins have a thickness of, for example, 20 nm to 100 nm. After the RIE etching process, the photoresist mask used in the lithographic etching process can be removed. The etch-stop capping layer can also be removed as well.

Figure 3:
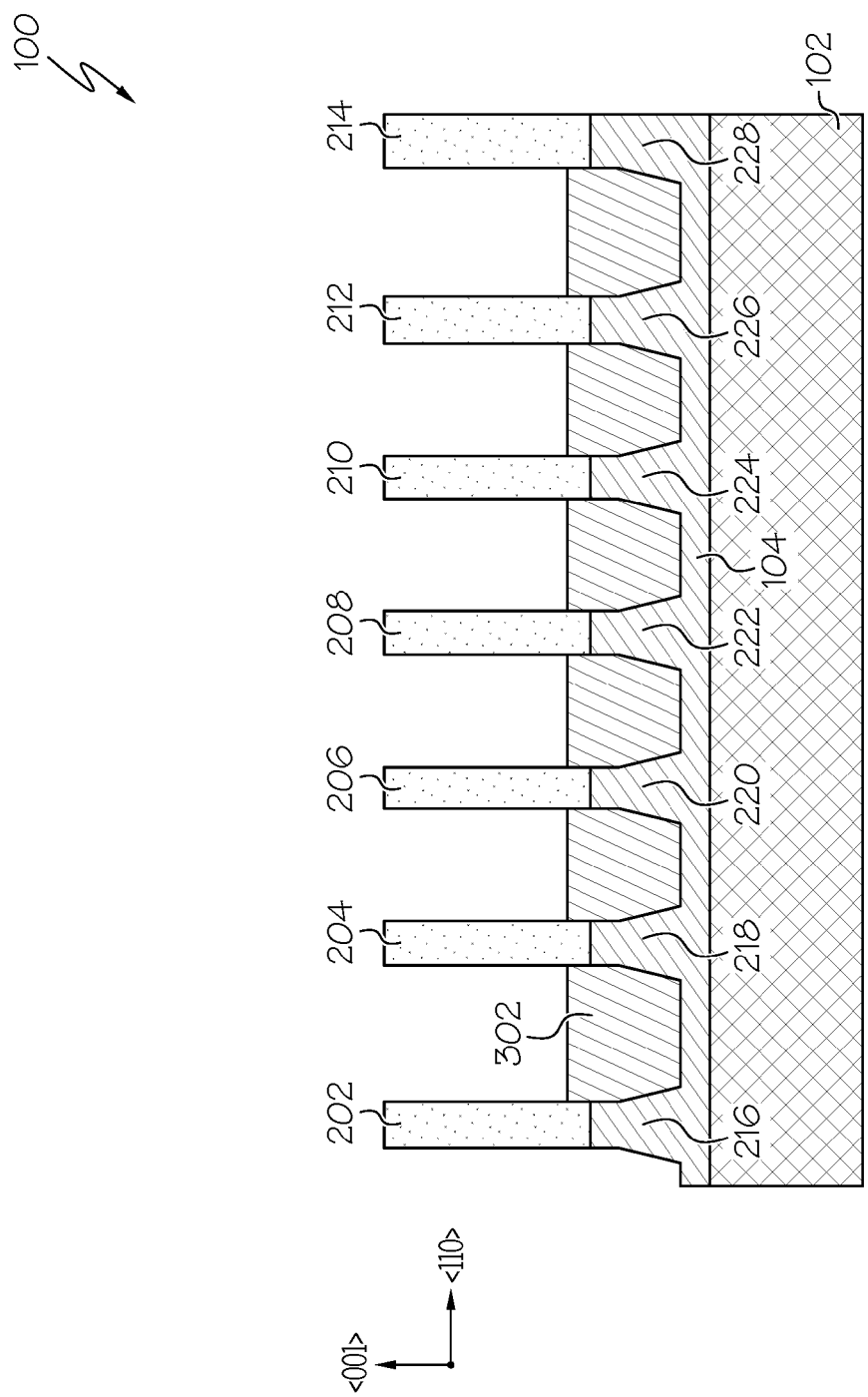
FIG. 3 is a cross-sectional view of the semiconductor structure after a doped epitaxy layer has been grown from a first source/drain layer according to one embodiment of the present invention.

FIG. 3 further shows that a bottom source/drain epitaxy layer 302 is formed between each of the pillar structures 216 to 228 and in contact with the fin structures 202 to 214. The bottom source/drain epitaxy layer 302 is formed within the wells/cavities 230 to 240 and includes a top surface that is above a bottom surface of the fin structures 202 to 214. In one embodiment, the bottom source/drain epitaxy layer 302 is formed using a directional epitaxy process where the growth is controlled to favor <001> growth. The bottom junction location is determined by where the bottom source/drain epitaxy layer 302 stops, so the bottom junction is self-aligned.

Figure 4:
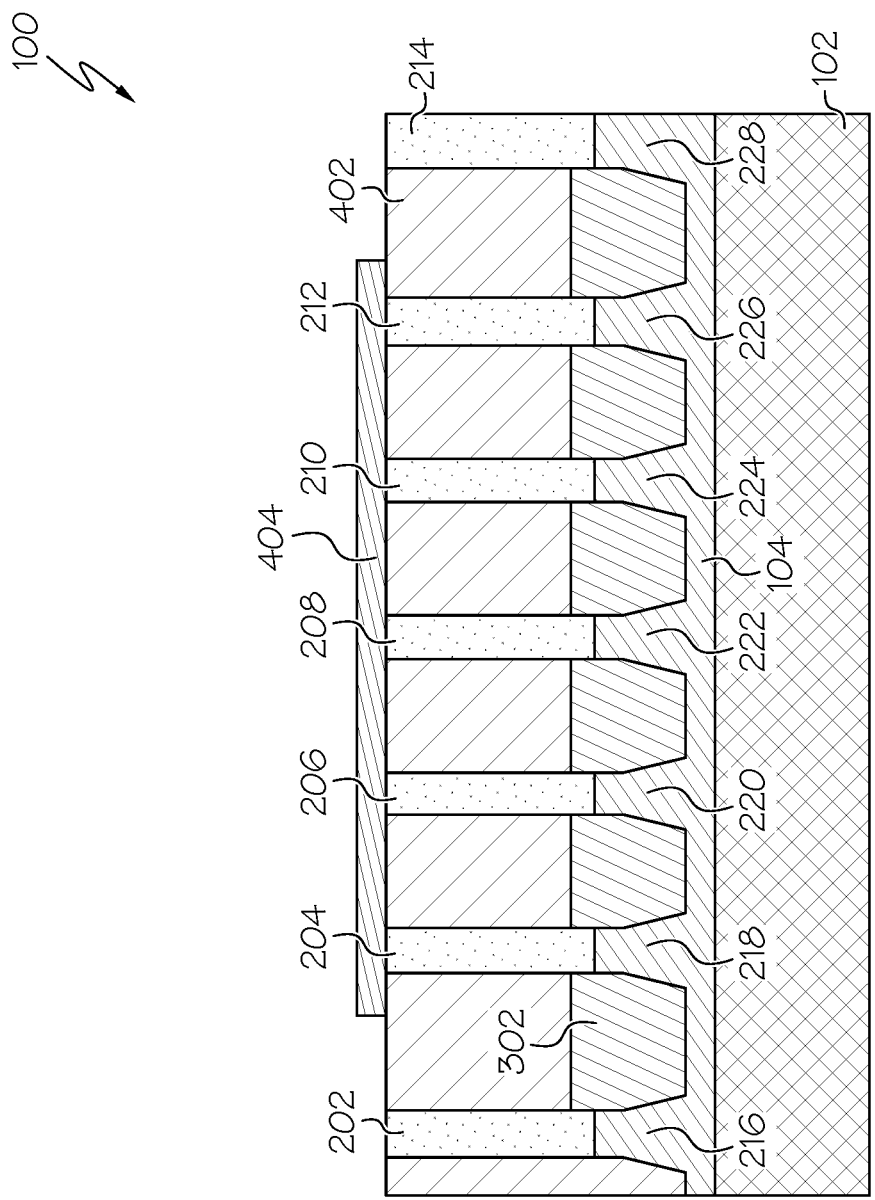
FIG. 4 is a cross-sectional view of the semiconductor structure after an oxide layer and hard masks have been formed according to one embodiment of the present invention.
Figure 5:
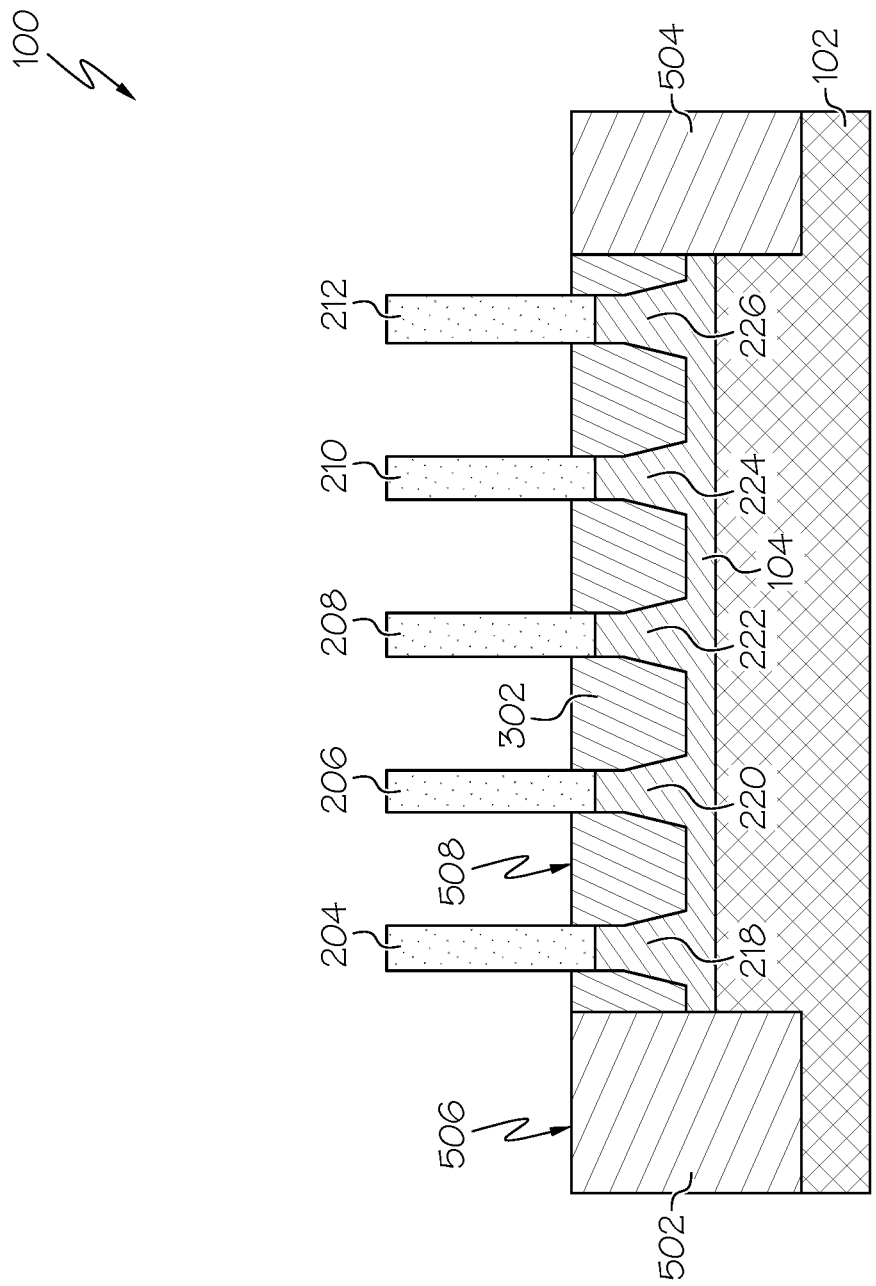
FIG. 5 is a cross-sectional view of the semiconductor structure after exposed portions of the structure have been etched and isolation regions have been formed according to one embodiment of the present invention.

After the bottom source/drain epitaxy layer 302 is formed, a flowable oxide 402 is deposited over the structure 100 as shown in FIG. 4. FIG. 4 also shows that a hard mask 404 is formed over the structure 100 leaving exposed portions where shallow trench isolation (STI) regions are to be formed. The hard mask 404 can be formed by, for example, depositing a suitable hard mask material, such as silicon nitride, onto the flowable oxide 402 and then patterned using standard lithography and etching techniques. Trenches are then formed within the exposed oxide 402 down into the substrate 102. The substrate 102 is etched below a top surface of the substrate 102 and above a bottom surface of the substrate 102. The trench forming process, in this example, also removed one or more of the fin structures 216, 228. Shallow trench isolation (STI) oxide is then deposited within the trenches forming STI regions 502, 504, as shown in FIG. 5. The flowable oxide 402, mask 404, and excess STI oxide are removed via chemical-mechanical polishing (CMP), selective etching, and/or the like. FIG. 5 shows that the resulting STI regions 502, 504 include a top surface 506 that is co-planar with a top surface 508 of the bottom source/drain epitaxy layer.

Figure 6:
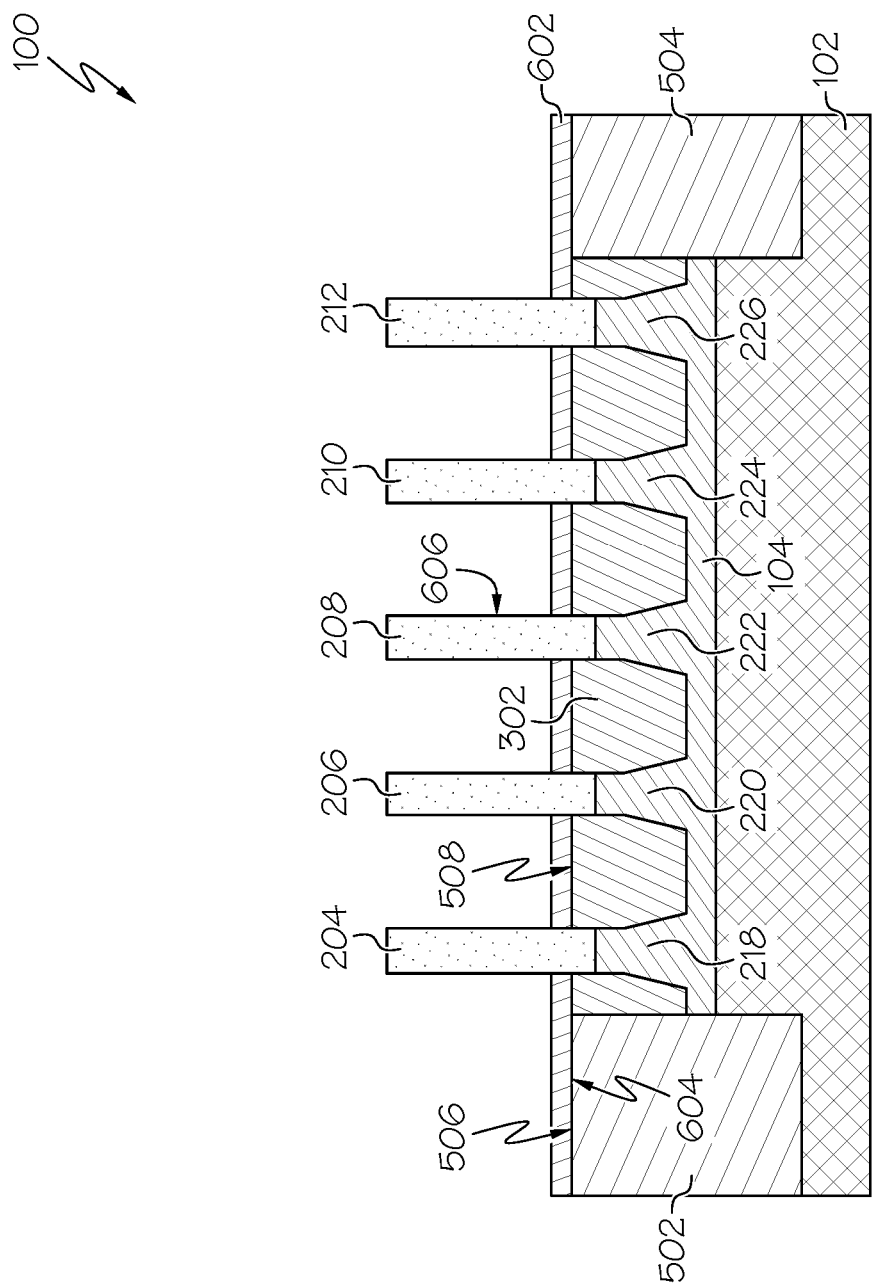
FIG. 6 is a cross-sectional view of the semiconductor structure after a spacer layer has been formed according to one embodiment of the present invention.

A bottom spacer layer 602 is then formed in contact with each of the remaining fin structures 204 to 212, as shown in FIG. 6. The bottom spacer 602 includes a bottom surface 604 the top surface 506 of the STI regions 502, 504 and the top surface 508 of the bottom source/drain epitaxy layer 302. The spacer 602 also contacts sidewalls 606 of the fin structures 204 to 212. In one embodiment, the bottom spacers 602 include an insulating material (such as silicon oxide, silicon nitride, silicon oxynitride, or a combination of these) and is formed using any conventional deposition process such as, for example, chemical vapor deposition (CVD) and subsequent etching techniques. The deposited spacer material is then subsequently etched to form the final spacer structures. In one embodiment, the spacers have a thickness of, for example, 3 nm to 30 nm.

Figure 7:
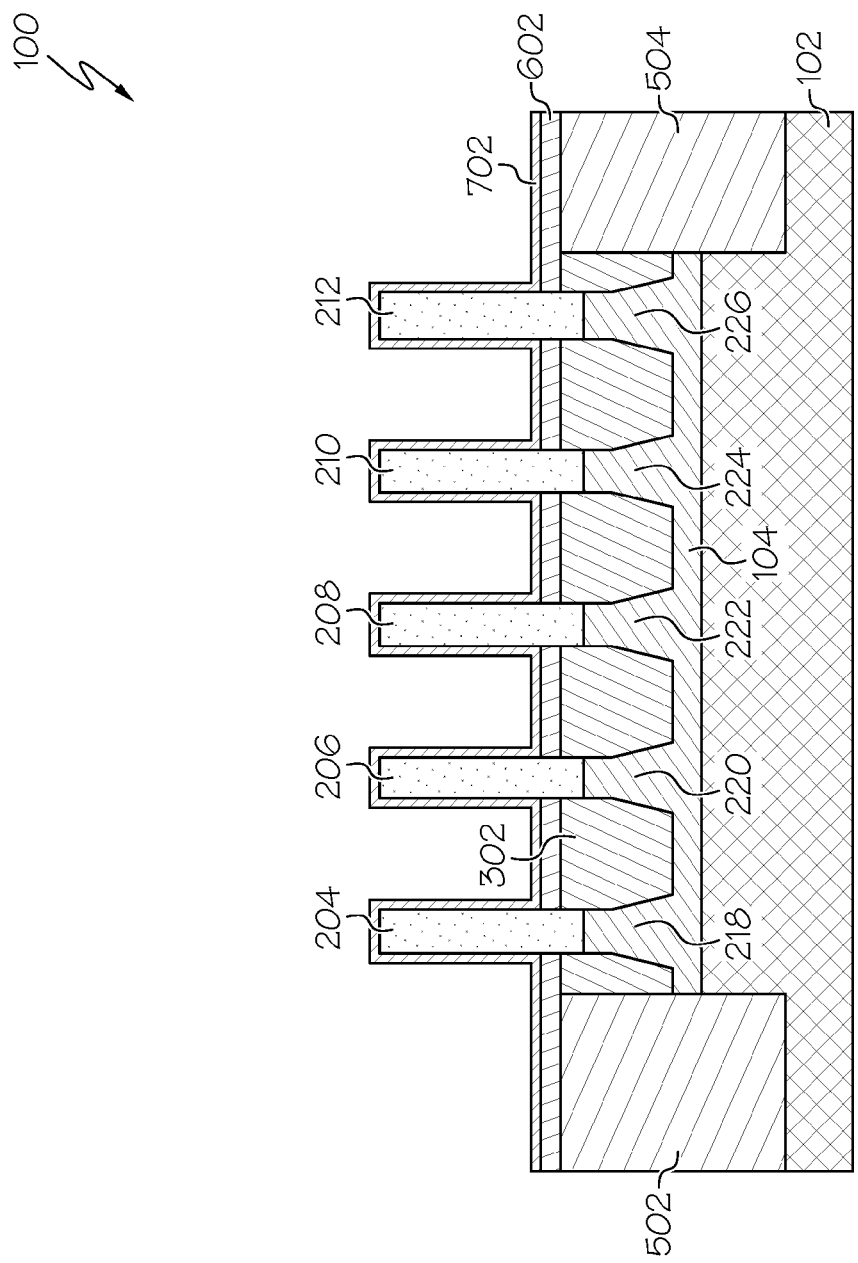
FIG. 7 is a cross-sectional view of the semiconductor structure after a high-k dielectric material has been deposited according to one embodiment of the present invention.
Figure 8:
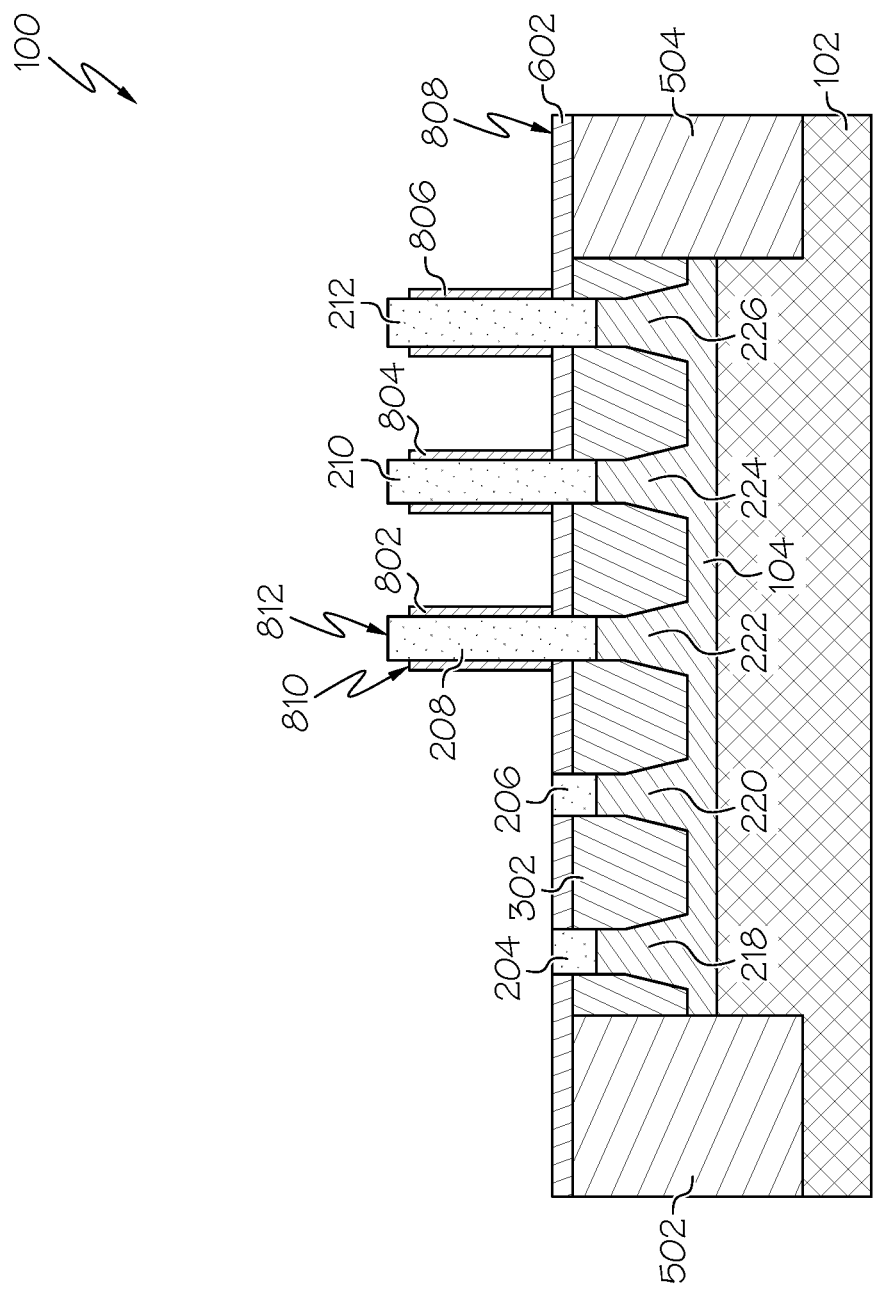
FIG. 8 is a cross-sectional view of the semiconductor structure after the high-k dielectric material has been polished/etched according to one embodiment of the present invention.

A high-k dielectric material 702 is then blanket deposited over the entire structure 100, for example by CVD (chemical vapor deposition), PECVD (plasma enhanced chemical vapor deposition), or ALD (Atomic layer deposition), as shown in FIG. 7. Excessive high-k gate dielectric material is removed, for example, by polishing such as chemically mechanical polishing (CMP) and/or etching to form high-k gate dielectric layers 802, 804, 808 as shown in FIG. 8. In the example shown in FIG. 8, this polishing/etching process also etches one or more fin structures 218, 220 down to the bottom spacer layer 602. However, etching of fin structures can occur at different points of the fabrication process as well such as after a top source/drain layer 910 (FIG. 10) has been formed.

Each high-k gate dielectric layer 802, 804, 806 is formed on and in contact with sidewalls 606 of a fin 208, 210, 212 and a top surface 810 of the bottom spacer 602. Each of the high-k gate dielectric layers 802, 804, 806 include a top surface 810 that is below with a top surface 812 of their fin 802, 804, 806. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 802, 804, 806 may further include dopants such as lanthanum or aluminum.

In one embodiment, the high-k layers 802, 804, 806 are part of a layer including a work function metal layer (not shown). In one embodiment, the work function metal layers are formed after and conformal to the high-k layers 802, 804, 806 employing CVD, sputtering, or plating. The work function metal layers include one or more metals having a function suitable to tune the work function of nFETs or pFETs. Exemplary first metals that can be employed in the work function metal layer include, but are not limited to La, Ti, and Ta. The thickness of the work function metal layers can be from 3 nm to 15 nm, although lesser and greater thicknesses can also be employed.

Figure 9:
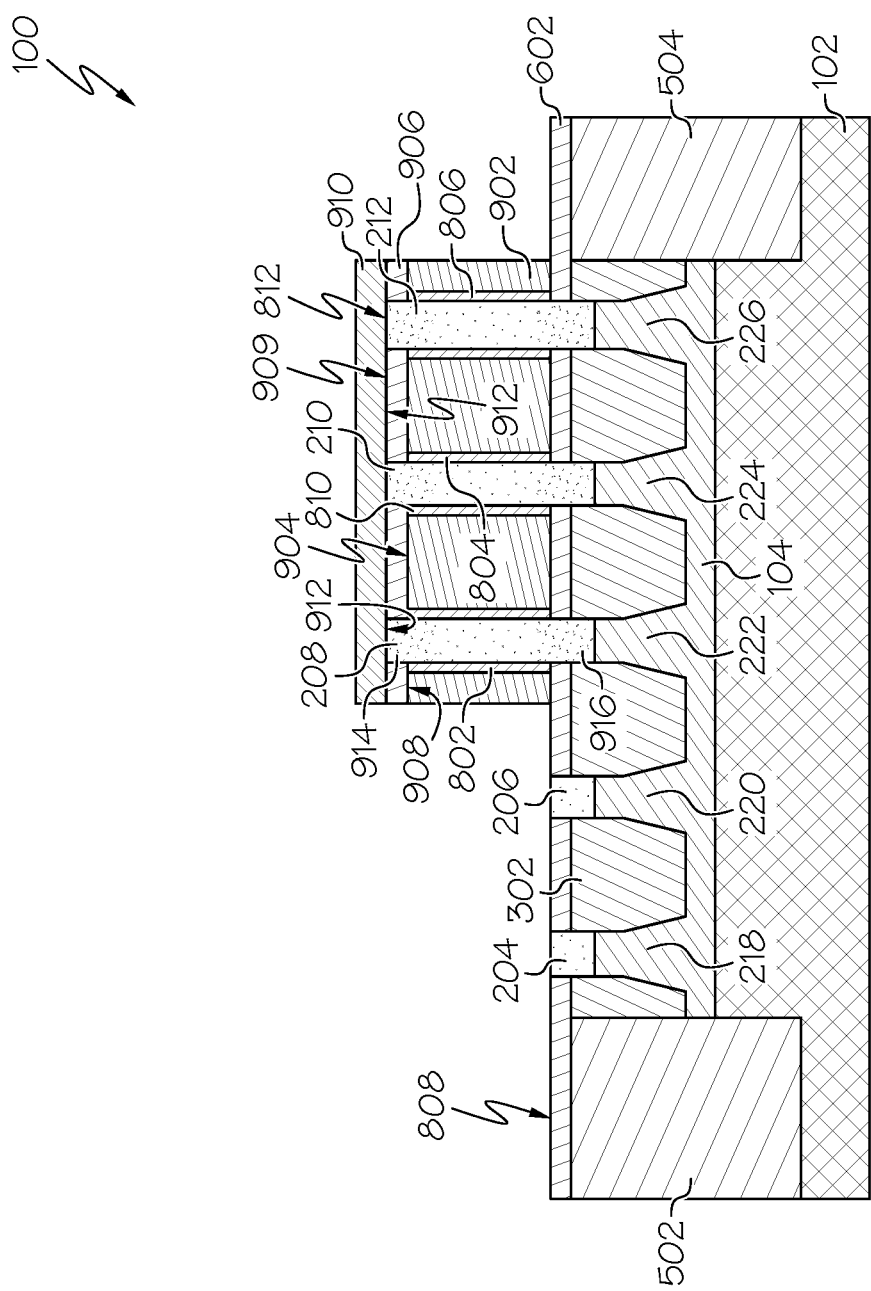
FIG. 9 is a cross-sectional view of the semiconductor structure after a gate structure and second source/drain layer have been formed according to one embodiment of the present invention.

FIG. 9 further shows that a metal gate 902 is formed around the fin structures 208, 210, 212. For example, a metal gate material can be deposited by atomic layer deposition (ALD) or physical vapor deposition (PVD). In one embodiment, the metal gate 902 is a continuous metal gate that wraps around all the fins 208, 210, 212. The metal gate 902 contacts the outer sidewalls of the high-k gate dielectric layers 802, 804, 806 and the top surface 808 of the bottom spacer 602. A top surface 904 of the metal gate 902 is co-planar with the top surface 810 of the high-k dielectric layers 802, 804, 806. In one embodiment, the metal gate 902 includes, for example, tungsten.

A top spacer layer 906 is then formed on the structure 100. The top spacer layer 906 includes a bottom surface 908 that contacts the top surface 904 of the metal gate 902; the top surface 810 of the high-k dielectric layers 902, 804, 806. A sidewall of the top spacer layer 906 contacts the portions of the sidewalls of the fin structures 208, 210, 212 that are above the top surface 810 of the high-k dielectric layers 802, 804, 806. A top surface 909 of the top spacer layer 906 is planar with the top surface 812 of the fin structures 208, 210, 212. In one embodiment, the top spacer 906 includes the same or different material as the bottom spacer 602. For example, the top spacer 906 can include an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

A doped layer 910 (also referred to herein as "top source/drain layer 910") is then formed using an epitaxy process. The top source/drain 910 is formed on and in contact with each the fins structures 208, 210, 212 and the top spacer layer 906. A bottom surface 912 of the top source/drain layer 910 contacts a top surface 812 of the fins 208, 210, 212 and a top surface 909 of the top spacer 906. The top source/drain layer 910 has a thickness in a range of, for example, about 10 nm to about 200 nm. However, other thicknesses are applicable as well. An anneal is performed to drive dopants 914, 916 from the bottom source/drain layer 104 and the top source/drain layer 910 into the fin structures 208, 210, 212.

Figure 10:
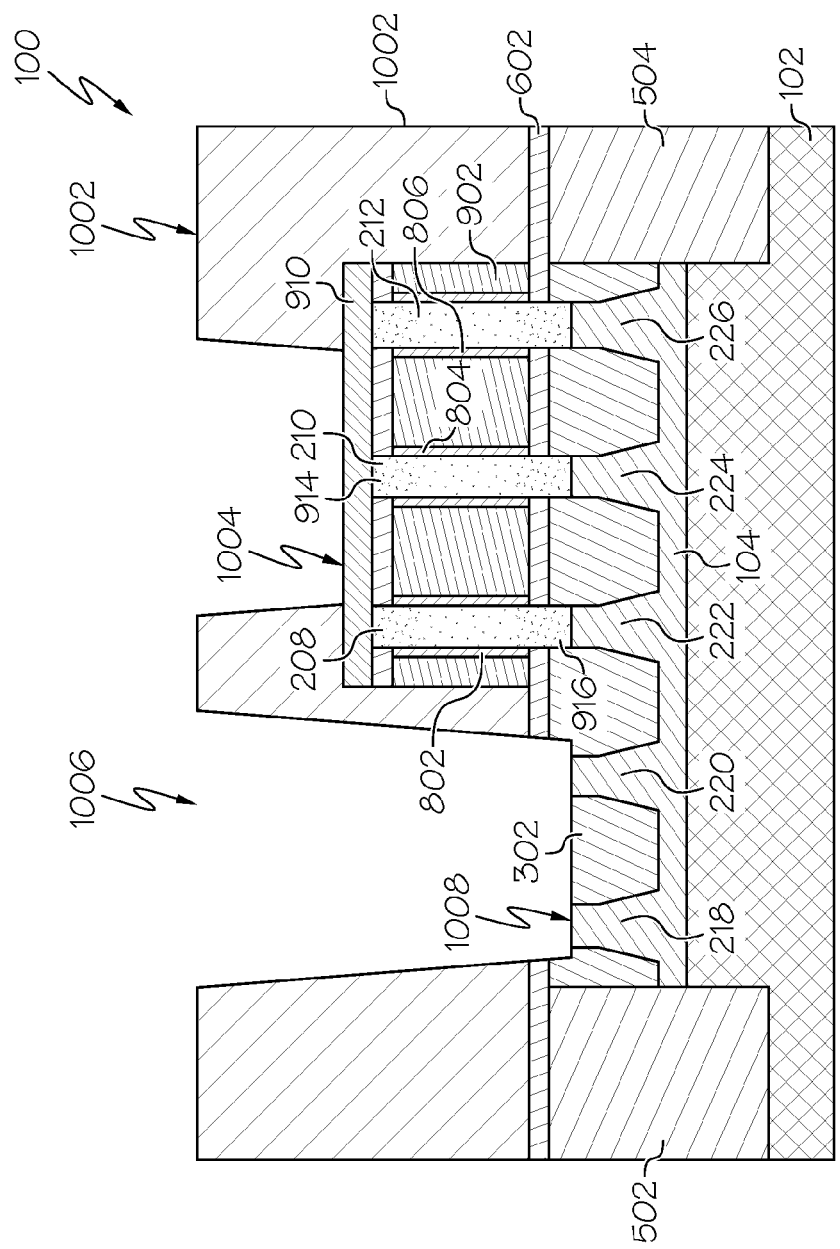
FIG. 10 is a cross-sectional view of the semiconductor structure after contact trenches have been formed according to one embodiment of the present invention.
Figure 11:
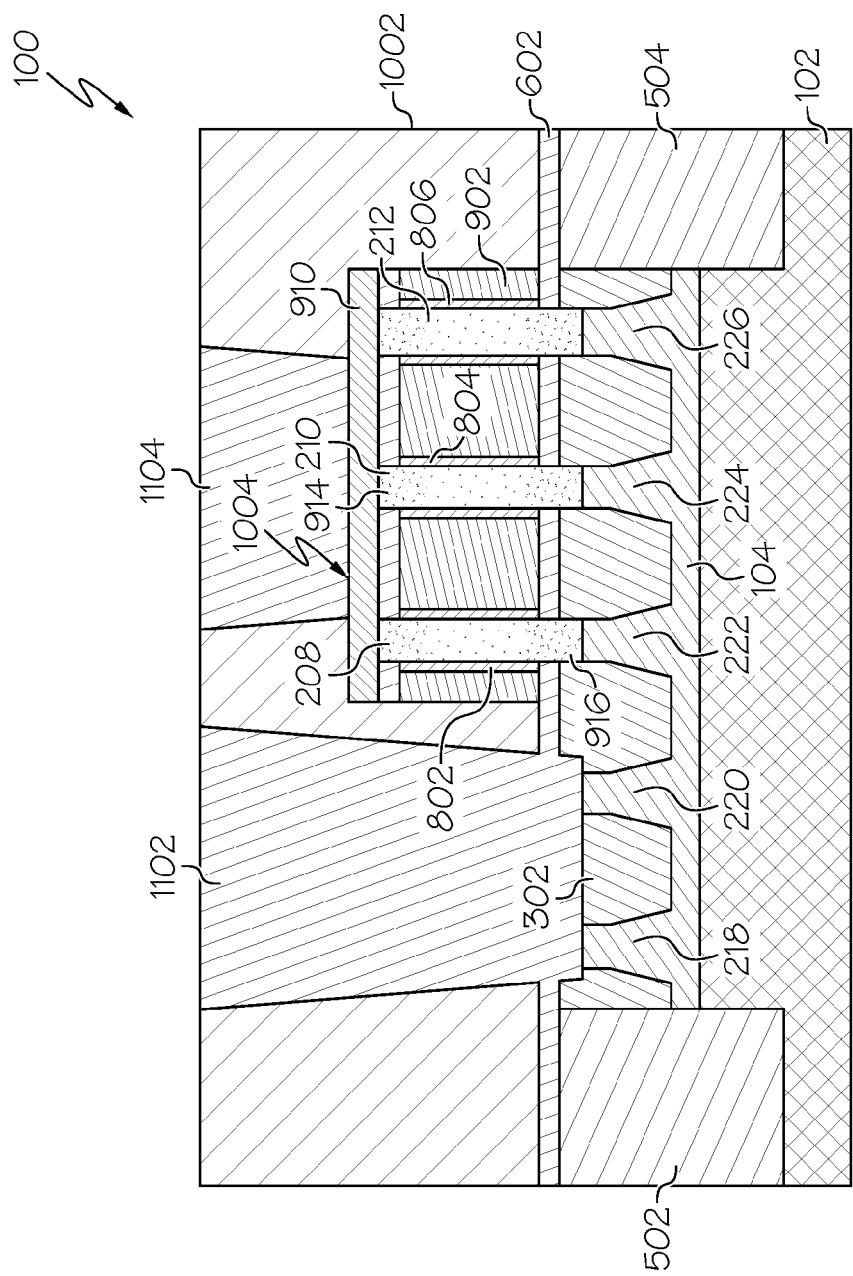
FIG. 11 is a cross-sectional view of the semiconductor structure after contacts have been formed according to one embodiment of the present invention.

A layer of dielectric material 1002 is then blanket deposited atop the entire structure 100, as shown in FIG. 10. The deposited dielectric material 1002 includes a top surface 1004 that is above a top surface 1006 of the top source/drain layer 910. The blanket dielectric may be a silicon-based material, such as SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The deposited dielectric 1002 is then patterned and etched to form a first via/trench 1006 adjacent to the gate structure down into to the bottom source/drain epitaxy layer 302. This process removes a portion of the bottom spacer 602 and the remaining portions of the fin structures 204, 206 that were previously etched down to the bottom spacer 602. The etching process further exposes a top surface 1008 of the bottom source/drain pillar structures 218, 220 adjacent to the gate structure and that were in contact with the removed fin structures 204, 206. The deposited dielectric 1002 is also patterned and etched to form a second via/trench 1010 directly above the gate structure and exposing at least a portion of the top surface 1004 of the top source/drain layer 910.

Conductive material is then deposited to form a first contact 1102 within the first trench 1006 and a second contact 1104 within the second trench 1010. The first contact 1102 contacts the top surface 1008 of the exposed bottom source/drain pillar structures 218, 220 and also contacts the bottom source/drain epitaxy layer 302. The second contact 1104 contacts a portion of the top surface 1004 of the top source/drain layer 910.

Figure 12:
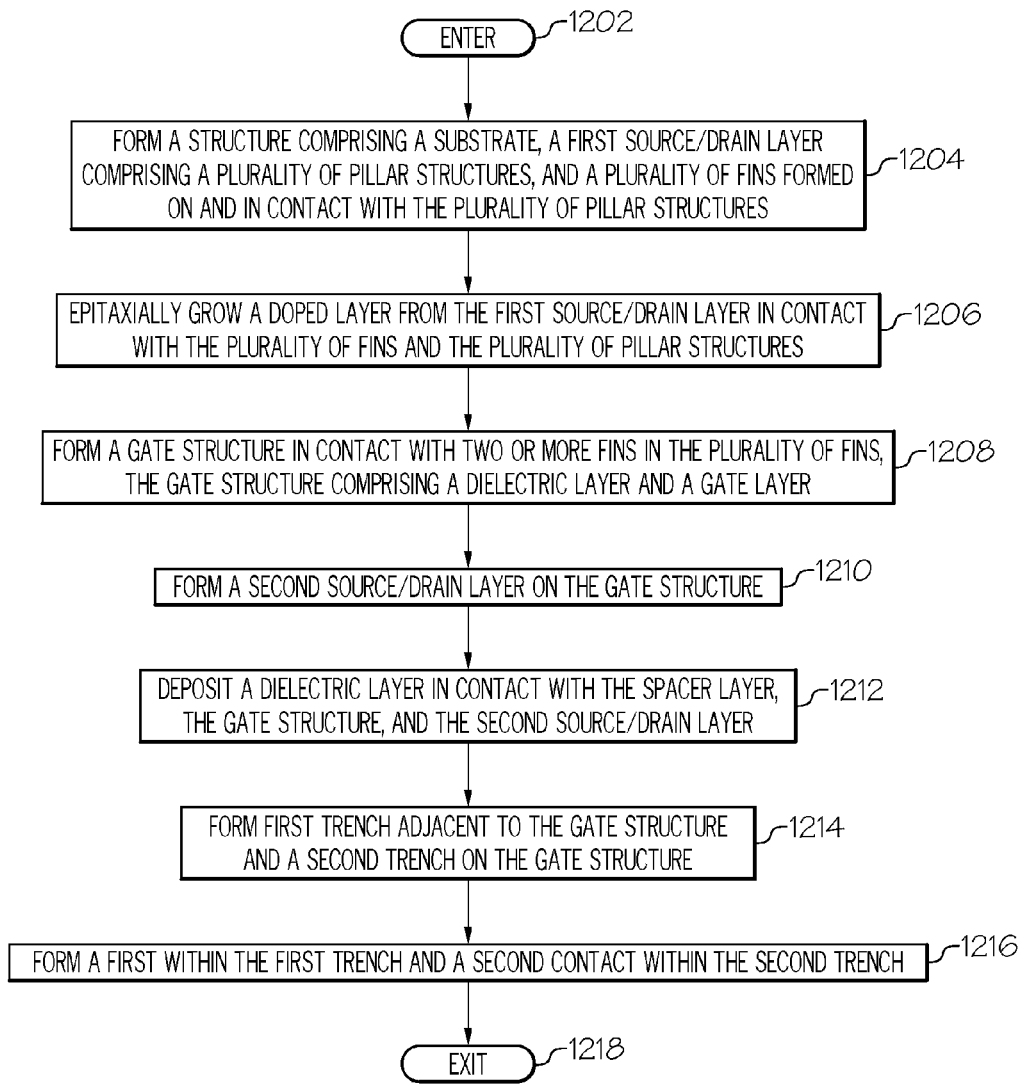
FIG. 12 is an operational flow diagram illustrating one process for fabricating vertical fin field-effect-transistor according to one embodiment of the present invention.

FIG. 12 is an operational flow diagram illustrating one process for fabricating a vertical fin field-effect-transistor. It should be noted that each of the steps shown in FIG. 12 has been discussed in greater detail above with respect to FIGS. 1-11. In FIG. 12, the operational flow diagram begins at step 1202 and flows directly to step 1204. A structure, at step 1204, is formed including a substrate, a first source/drain layer including a plurality of pillar structures, and a plurality of fins formed on and in contact with the plurality of pillar structures. A doped layer, at step 1206, is epitaxially grown on the first source/drain layer in contact with the plurality of fins and the plurality of pillar structures.

A gate structure, at step 1208 is formed in contact with two or more fins in the plurality of fins. The gate structure includes a dielectric layer and a gate layer. A second source/drain layer, at step 1210, is formed on the gate structure. A dielectric layer, at step 1212, is deposited in contact with the spacer layer, the gate structure, and the second source/drain layer. A first trench is formed adjacent to the gate structure and a second trench is formed on the gate structure, at step 1214. A first contact is formed within the first trench and a second contact is formed within the second trench, at step 1216. The operational flow then exits at step 1218.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a vertical fin field-effect-transistor, the method comprising:
    forming a structure comprising a substrate, a first source/drain layer comprising a plurality of pillar structures, and a plurality of fins formed on and in contact with the plurality of pillar structures;
    epitaxially growing a doped layer on the first source/drain layer in contact with the plurality of fins and the plurality of pillar structures;
    forming a gate structure in contact with two or more fins in the plurality of fins, the gate structure comprising a dielectric layer and a gate layer;

forming a second source/drain layer on the gate structure; and performing an anneal, the anneal driving dopants from the first source/drain layer and second source/drain layer into the two or more fins.

2. The method of claim 1, wherein forming the structure comprises:
etching through a channel layer and partially into the first source/drain layer, the etching forming the plurality of fins from the channel layer and the plurality of pillar structures.

3. The method of claim 1, further comprising:
after epitaxially growing the doped layer, forming a spacer layer in contact with the doped layer and the plurality of fins.

4. The method of claim 1, further comprising:
after forming the gate structure, forming a spacer layer in contact with the dielectric layer, the gate layer, and the two or more fins.

5. The method of claim 1, further comprising:
depositing a dielectric layer in contact with the spacer layer, the gate structure, and the second source/drain layer.

6. The method of claim 5, further comprising:
forming a first trench within the dielectric layer adjacent to the gate structure, the first trench exposing a portion of at least one pillar structure in the plurality of pillar structures and a portion of the doped layer;
forming at least a second trench within the dielectric layer on the gate structure, the second trench exposing a portion of the second source/drain layer;
forming a first contact within the first trench; and
forming a second contact within the second trench.

7. The method of claim 1, further comprising:
depositing a flowable oxide over the structure;
forming a mask in contact with a portion of the flowable oxide and over a subset of fins of the plurality of fins and a subset of pillar structures of the plurality of pillar structures;
forming one or more trenches within the flowable oxide to expose a portion of the substrate; and
depositing an isolation material within the one or more trenches.

8. The method of claim 1, further comprising:
etching one or more fins of the plurality of fins down to a spacer layer in contact with the doped layer and the plurality of fins.

9. The method of claim 8, wherein the etching is performed after a dialectic material for the dielectric layer has been deposited.

10. The method of claim 8, wherein the etching is performed after the second source/drain layer has been formed.

11. A method for fabricating a vertical fin field-effect-transistor, the method comprising:
forming a structure comprising a substrate, a first source/drain layer comprising a plurality of pillar structures, and a plurality of fins formed on and in contact with the plurality of pillar structures;
epitaxially growing a doped layer on the first source/drain layer in contact with the plurality of fins and the plurality of pillar structures;
etching one or more fins of the plurality of fins, wherein a top surface of the one or more fins is below a top surface of remaining fins of the plurality of fins;
forming a gate structure in contact with two or more of the remaining fins in the plurality of fins, the gate structure comprising a dielectric layer and a gate layer; and
forming a second source/drain layer on the gate structure.

12. The method of claim 11, wherein forming the structure comprises:
etching through a channel layer and partially into the first source/drain layer, the etching forming the plurality of fins from the channel layer and the plurality of pillar structures.

13. The method of claim 11, further comprising:
after epitaxially growing the doped layer, forming a spacer layer in contact with the doped layer and the plurality of fins.

14. The method of claim 11, further comprising:
after forming the gate structure, forming a spacer layer in contact with the dielectric layer, the gate layer, and the two or more fins.

15. The method of claim 14, wherein the one or more fins are etched down to a top surface of the spacer layer.

16. The method of claim 11, further comprising:
performing an anneal, the anneal driving dopants from the first source/drain layer and second source/drain layer into the two or more fins.

17. The method of claim 11, further comprising:
depositing a dielectric layer in contact with the spacer layer, the gate structure, and the second source/drain layer.

18. The method of claim 17, further comprising:
forming a first trench within the dielectric layer adjacent to the gate structure, the first trench exposing a portion of at least one pillar structure in the plurality of pillar structures and a portion of the doped layer;
forming at least a second trench within the dielectric layer on the gate structure, the second trench exposing a portion of the second source/drain layer;
forming a first contact within the first trench; and
forming a second contact within the second trench.

19. The method of claim 11, wherein the one or more fins are etched after a dialectic material for the dielectric layer has been deposited.

20. The method of claim 11, further comprising:
depositing a flowable oxide over the structure;
forming a mask in contact with a portion of the flowable oxide and over a subset of fins of the plurality of fins and a subset of pillar structures of the plurality of pillar structures;
forming one or more trenches within the flowable oxide to expose a portion of the substrate; and
depositing an isolation material within the one or more trenches.

* * * * *